United States Patent [19]
Dick et al.

[11] Patent Number: 5,864,256
[45] Date of Patent: Jan. 26, 1999

[54] CIRCUIT ARRANGEMENT WITH A FILTER QUADRIPOLE

[75] Inventors: Burkhard Dick, Hamburg; Manfred Biehl, Norderstedt; Winfried Jansen, Quickborn; Bernd Pille; Norbert Wirges, both of Hamburg, all of Germany

[73] Assignee: U.S. Philips Corporation, New York, N.Y.

[21] Appl. No.: 812,189

[22] Filed: Mar. 6, 1997

[51] Int. Cl.$^6$ ....................................................... H03K 5/00
[52] U.S. Cl. .......................... 327/552; 327/559; 327/362; 327/311; 333/172; 330/303
[58] Field of Search ..................... 327/552, 558, 327/559, 311, 362, 563; 333/172; 330/303

[56] References Cited

U.S. PATENT DOCUMENTS 3,786,363  1/1974  Lelie ........................................ 327/558

*Primary Examiner*—Dinh Le
*Attorney, Agent, or Firm*—Jack D. Slobod

[57] ABSTRACT

A description is given of a circuit arrangement comprising a filter quadripole having two output terminals and a voltage follower circuit having two terminals, said terminals having identical electric potentials when the voltage follower circuit is in its turned-on state, each of the terminals of the voltage follower circuit being connected to one of the output terminals of the filter quadripole respectively, and the voltage follower circuit only being in its turned-on state during the turn-on time interval of the circuit arrangement. This circuit arrangement is suitable for a receiver circuit, more particularly, for a pager and has a very brief turn-on time.

5 Claims, 1 Drawing Sheet

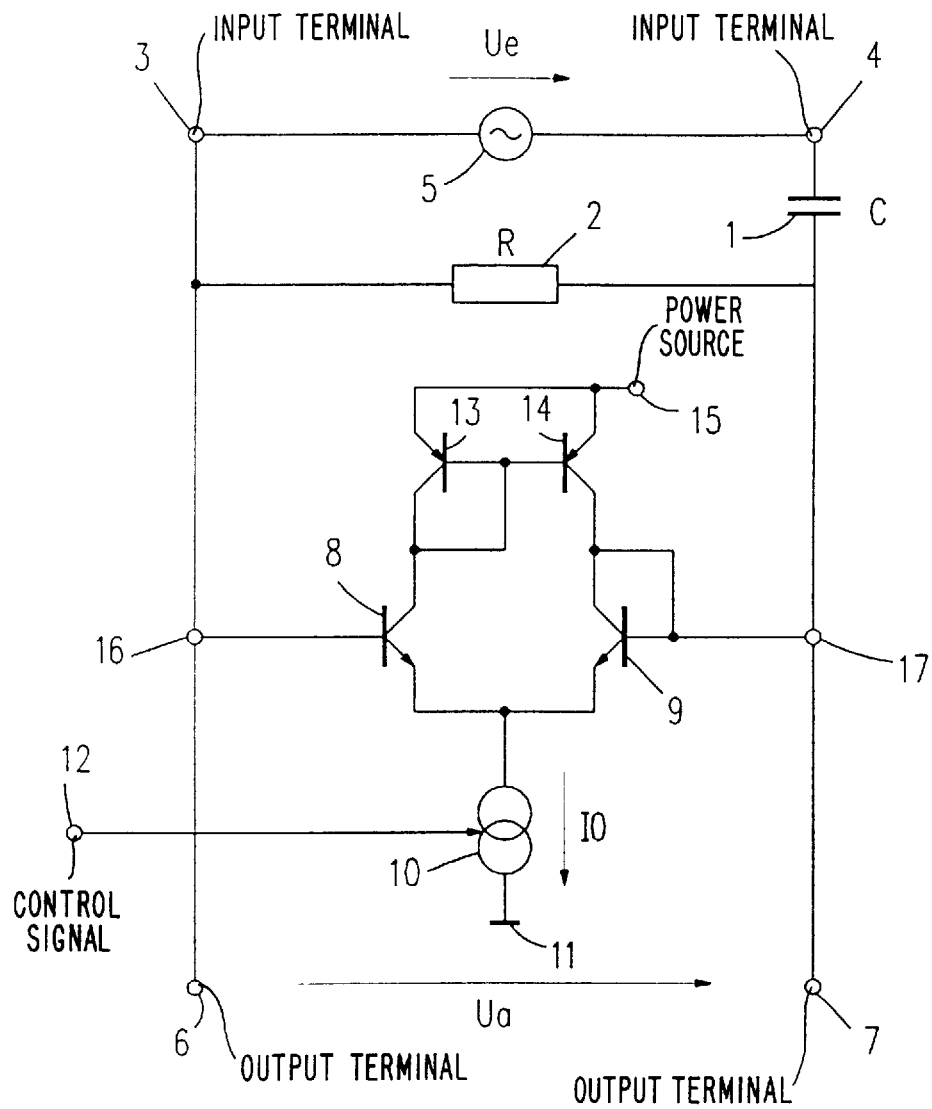

5,864,256

1

CIRCUIT ARRANGEMENT WITH A FILTER QUADRIPOLE

BACKGROUND OF THE INVENTION

The invention relates to a circuit arrangement with a filter quadripole, (four terminal device) Such circuit arrangements are used, for example, in receiver circuits as used, for example, for pagers.

Receiver circuits are generally to satisfy certain requirements as regards the turn-on time. The term turn time is then used for the period of time between applying the supply voltage to the receiver circuit and the reaching of an operating state in which a perfect processing of the signals received by the receiver circuit is possible. In battery-operated receiver circuits, the turn-on time has a considerable effect on the useful life of the battery.

For example, pagers need to have turn-on times in the range of milliseconds. It must be born in mind that this turn-on time for the whole pager is formed by the sum of the turn-on times of individual circuit components and sub-sets, so that the duration of the turn-on time for receiver circuits in pagers is required to be restricted to a few microseconds.

Alternatively, receiver circuits having a low intermediate frequency, more particularly, in the kilohertz range, require high-pass filters for d.c. decoupling in a high-gain signal path for the received signal that is to be processed which high-pass filters have a cut off frequency that is selected to be low with an accordingly low intermediate frequency i.e. have a high time constant. During the turn-on time i.e. while the receiver circuit is taken into operation, the signal regularly shows voltage jumps produced by this receiver circuit, which jumps may be the result of asymmetries, self-reception but also other influences. In the case of self-reception, the signal produced by the local oscillator of the receiver circuit overcouples on its antenna input and, in consequence, is mixed with itself to an offset d.c. voltage in the mixer connected to the local oscillator. In the build-up time of the oscillator, during the turn-or time when the receiver circuit is taken into operation, this offset d.c. voltage appears as a voltage jump on the output of the receiver circuit. This voltage jump is amplified with high gain provided for the signal to be received in the receiver circuit and, as a result, overloads the high-pass filters which the signal passes trough in the signal path. Depending on the amplitude of this voltage jump (noise voltage) and the time constant of the high-pass filters, the decay time of the noise voltage on the output of the receiver circuit (or of the high-pass filters, respectively) may be several milliseconds. For the requirements to be made on the pagers and their receiver circuits, the decay time is much too long.

OBJECTS AND SUMMARY OF THE INVENTION

It is an object of the invention to provide a circuit arrangement comprising a filter quadripole for a receiver circuit, more particularly, for a pager, which circuit arrangement has a considerably shorter urn-on time than a pager.

This object is achieved by the circuit arrangement comprising a filter quadripole having two output terminals and
a voltage follower circuit having two terminal, said terminals having identical electric potentials when the voltage follower circuit is in its turned-on state, each of the terminals of the voltage follower circuit being connected to one of the output terminals of the filter

2 quadripole respectively, and the voltage follower circuit only being in its turned-on state during the turn-on time interval of the circuit arrangement.

The invention utilizes the recognition that the turn-on time is determined, in essence, by the variation with time of the signal on the output of the filter quadripole when the circuit arrangement is taken into operation. The circuit arrangement according to the invention provides a reduction of the decay time of the noise voltages on the output terminals of the filter quadripole from the millisecond range to the microsecond range. This satisfies an essential requirement of reducing the turn-on time of the whole receiver circuit to the microsecond range.

Special advantages are obtained when a high-pass filter takes the place of the filter quadripole. The high-pass filter output terminals are bridged by the terminals of the voltage follower circuit. The voltage follower circuit, which is only in operation during the turn-on time, forces the voltage potentials on the output terminals of the filter quadripole to match. When the filter quadripole is taken into operation, the voltage follower circuit decisively accelerates building-up times and transients respectively in the filter quadripole.

Further advantageous embodiments of the invention will be discussed hereinafter.

A very simple embodiment of the invention is shown in the drawing and will be further explained in the following.

BRIEF DESCRIPTION OF THE DRAWING

The sole figure of this drawing diagrammatically shows a filter quadripole in accordance with the invention.

DETAILED DESCRIPTION OF THE PREFERRED EMBODIMENTS

Referring to the sole figure of the drawing, the filter quadripole shown therein is arranged as a high-pass filter and comprises a capacitor 1 as a capacitive circuit element and a resistor 2 as an ohmic circuit element. The capacitor 1 has the capacitance C, the resistor 2 the resistance R. The product R .C determines in known manner the cut off frequency of the filter quadripole, i.e. of the high-pass filter forming this filter quadripole. For receiving an input signal, two input terminals 3, 4 of the filter quadripole 1, 2 are connected to a signal voltage source 5 which produces an input voltage Ue (signal voltage, useful signal) when the circuit arrangement is in operation. When the input voltage Ue is supplied, the filter quadripole 1, 2 produces an, output voltage Ua on two output terminals 6, 7. The capacitor 1 of the filter quadripole is arranged as a series capacitor between the input terminal 4 and the output terminal 7, the resistor 2 as a shunt resistor between the output terminals 6, 7.

A voltage follower circuit comprises a transistor pair formed by two transistors 8, 9 in the present example arranged as npn transistors. Their main current paths are interconnected via their emitter terminals and connected to a switchable current source 10 which is also connected to ground 11. The switchable current source 10 can be turned on and off via a switch input 12. In the tuned-on state it caries a direct current IO, in the turned-off state it is currentless. On the other hand, the transistor pair 8, 9 is coupled with its main current paths to a current mirror circuit which comprises two pnp transistors 13, 14 in the example shown in the figure. Either of these pnp transistors that forms the input transistor of the current mirror circuit 13, 14—transistor 13—and whose base and collector terminals are interconnected, is connected to the main current path of the transistor S. The second pnp transistor 14 forms the output transistor of the mirror current path while its collector terminal is connected to the main current path of the second transistor 9 of the transistor pair. Furthermore, the two emitter terminals of the mirror current circuit 13, 14 are connected to a power supply terminal 15, and the collector terminal and the base terminal of the second transistor 9 of the transistor pair are interconnected. The base terminals of the transistors 8, 9 form each a terminal 16, 17 by which the voltage follower circuit is connected to the output terminals 6, 7 respectively, of the filter quadripole 1, 2.

When the filter quadripole 1, 2 and the circuit arrangement comprising same are operated in accordance with the invention, the switchable current source 10 is rendered currentless through the switch input 12. This provides that the whole voltage follower circuit is inoperative and the transfer characteristic of the filter quadripole 1, 2 is not affected. In the starting phase of the filter quadripole 1, 2, i.e. when it is taken into operation (the power supply turned on), the switchable current source 10 is turned on for a defined period of time. It can be turned on trough the switch input 12 by a control circuit which controls the whole operation of the circuit arrangement, which arrangement includes the filter quadripole 1, 2, for example, of a receiver circuit or a pager respectively. As long as the d.c. current IO flows i.e. as long as the switchable current source 10 continues to be turned on, the voltage follower circuit forces corresponding voltage potentials to be present on its terminals 16 and 17 i.e. also on the output terminals 6 and 7 of the filter quadripole 1, 2. This provides a very rapid and strong attenuation of any voltage jump on these output terminals 6, 7. If a voltage difference already occurs on the output terminals 6 and 7 before the switchable control source 10 is turned on, the voltage follower circuit rapidly causes this voltage difference to fade out. In the present example, this means that the capacitor 1 is recharged for a period of time which can be set to the desired value by accordingly selecting the d.c. current IO. As a result, the turn-on time of the filter quadripole may be made very brief.

After the turn-on time has ended, the switchable current source 10 is again turned off and, therefore, no longer consumes power from the power supply terminal 15. Even if the d.c. current IO is very large, this d.c. current forms only a minor load on the power supply terminal 15, i.e. for example, a battery connected to this terminal.

We claim:

1. A filter circuit comprising:
   a filter quadripole having two input terminals for receiving an input signal which is subject to a voltage jump during a turn-on interval and two output terminals for presenting a filtered output signal in response to the input signal; and
   a voltage follower circuit coupled to the two output terminals and being switchable between an inactive state and an active state in response to a control signal for maintaining output voltages on the two output terminals substantially identical when the voltage follower is in the active state;
   wherein the voltage follower circuit is switched in response to the control signal to be in the active state during the turn-on interval in order to reduce a corresponding voltage jump in the filtered output signal during the turn-on interval.

2. The filter circuit as claimed in claim 1, wherein the filter quadripole is a high-pass filter.

3. The filter circuit as claimed in claim 2, wherein the filter quadripole comprises at least one capacitive element connected between at least one of the two input terminals and at least one of the two output terminals, and at least one ohmic circuit element connected between the two output terminals.

4. The filter circuit as claimed in claim 1, wherein the voltage follower circuit comprises a transistor pair having respective main current paths which at one end are interconnected and connected to a switchable current source and, at the other end, are coupled to a current mirror circuit, said transistor pair having control terminals which are coupled to the two output terminals of the voltage follower circuit, the current mirror circuit having an output which is connected to one of the main current paths and directly to one of the control terminals of the transistor pair.

5. In a pager, a filter circuit comprising:
   a filter quadripole having two input terminals for receiving an input signal which is subject to a voltage jump during a turn-on interval of the pager and two output terminals for presenting a filtered output signal in response to the input signal; and
   a voltage follower circuit coupled to the two output terminals and being switchable between an inactive state and an active state in response to a control signal for maintaining output voltages on the two output terminals substantially identical when the voltage follower is in the active state;
   wherein the voltage follower circuit is switched in response to the control signal to be in the active state during the turn-on interval in order to reduce a corresponding voltage jump in the filtered output signal during the turn-on interval.

* * * * *